United States Patent
Yan et al.

(10) Patent No.: US 9,653,291 B2
(45) Date of Patent: May 16, 2017

(54) METHOD FOR REMOVING NATIVE OXIDE AND RESIDUE FROM A III-V GROUP CONTAINING SURFACE

(71) Applicant: Applied Materials, Inc., Santa Clara, CA (US)

(72) Inventors: Chun Yan, San Jose, CA (US); Xinyu Bao, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 92 days.

(21) Appl. No.: 14/540,104

(22) Filed: Nov. 13, 2014

(65) Prior Publication Data
US 2016/0141175 A1    May 19, 2016

(51) Int. Cl.
| | |
|---|---|
| *H01L 21/306* | (2006.01) |
| *H01L 21/02* | (2006.01) |
| *B08B 7/00* | (2006.01) |
| *B08B 7/04* | (2006.01) |
| *B08B 5/00* | (2006.01) |

(52) U.S. Cl.
CPC .......... *H01L 21/02661* (2013.01); *B08B 5/00* (2013.01); *B08B 7/0035* (2013.01); *B08B 7/0071* (2013.01); *B08B 7/04* (2013.01); *H01L 21/0245* (2013.01); *H01L 21/02455* (2013.01); *H01L 21/02538* (2013.01); *H01L 21/02046* (2013.01)

(58) Field of Classification Search
CPC  H01L 21/02046; H01L 21/02661; B08B 5/00
See application file for complete search history.

(56) References Cited

U.S. PATENT DOCUMENTS

| | | | |
|---|---|---|---|
| 6,811,448 | B1 | 11/2004 | Paton et al. |
| 2006/0051966 | A1 | 3/2006 | Or et al. |
| 2006/0228900 | A1 | 10/2006 | Dip et al. |
| 2007/0238302 | A1* | 10/2007 | Dip ................... H01L 21/02046 438/706 |
| 2009/0029529 | A1 | 1/2009 | Shin |
| 2012/0276740 | A1* | 11/2012 | Zheng ................. H01L 21/0206 438/682 |

* cited by examiner

*Primary Examiner* — Kimberly Rizkallah
*Assistant Examiner* — Maria Ligai
(74) *Attorney, Agent, or Firm* — Patterson + Sheridan, LLP (57) ABSTRACT

Native oxides and residue are removed from surfaces of a substrate by performing a multiple-stage native oxide cleaning process. In one example, the method for removing native oxides from a substrate includes supplying a first gas mixture including an inert gas onto a surface of a material layer disposed on a substrate into a first processing chamber, wherein the material layer is a III-V group containing layer for a first period of time, supplying a second gas mixture including an inert gas and a hydrogen containing gas onto the surface of the material layer for a second period of time, and supplying a third gas mixture including a hydrogen containing gas to the surface of the material layer while maintaining the substrate at a temperature less than 550 degrees Celsius.

2 Claims, 6 Drawing Sheets

METHOD FOR REMOVING NATIVE OXIDE AND RESIDUE FROM A III-V GROUP CONTAINING SURFACE

BACKGROUND

Field

Embodiments of the present invention relate generally to semiconductor substrate processing and, more particularly, to systems and methods for cleaning native oxide and residue from a substrate surface having III-V group containing materials.

Description of the Related Art

In the microfabrication of integrated circuits and other devices, electrical interconnect features, such as contacts, vias, and lines, are commonly constructed on a substrate using high aspect ratio apertures formed in a dielectric material. The presence of native oxides and other contaminants such as etch residue within these small apertures is highly undesirable, contributing to defect formation during subsequent film growth or metalization of the aperture and increasing the electrical resistance of the interconnect feature.

A native oxide typically forms when a substrate surface is exposed to oxygen and/or water. Oxygen exposure occurs when substrates are moved between processing chambers at atmospheric or ambient conditions, or when a small amount of oxygen/moisture remains in a processing chamber and/or transfer chamber. In addition, native oxides may result from contamination during etching processes, prior to or after a deposition process. Native oxide films are usually very thin, for example between 5-20 angstroms, but thick enough to cause difficulties in subsequent fabrication processes. Furthermore, native oxide may cause high contact resistance in source and drain areas and adversely increase the thickness of equivalent of oxide (EOT) in channel areas. Therefore, a native oxide layer is typically undesirable and needs to be removed prior to subsequent fabrication processes.

In conventional practice, $NF_3$ and $NH_3$ gas mixtures are often used to remove native oxide from a substrate surface, which typically is a silicon surface. As circuit densities increase for next generation devices, the widths of interconnects, such as vias, trenches, contacts, gate structures and other features, as well as the dielectric materials therebetween, have decreased to less than 20 nm in width. Different materials are constantly developed to provide better electrical performance in semiconductor devices as the device dimension shrinks. For example, Ge containing materials, III-V group materials or III-V group compounds, such as Ge, SiGe, GaAs, InP, InAs, GaAs, GaP, InGaAs, and InGaAsP, and the like, are getting more and more attention for use in source-drain, channel, gate structure, metal silicide, or other regions of semiconductor devices. However, conventional native oxide removal technique by dry etching cannot efficiently remove native oxide from these surfaces, since conventional techniques are typically designed to remove native silicon oxide layer, in which the silicon atoms are attacked by $NH_4F$ or $NH_4F.NF$ forming solid by-produce $(NH_4)_2SiF_6$ and sublimated into vapor phase gas, which is readily pumped out of the processing chamber. In contrast, III-V group materials or III-V group compounds do not react with $NH_4F$ or $NH_4F.NF$ to form a vapor gas by-product or readily sublimated into gas phase by-product which can be pumped out of the processing chamber. Instead, the conventional fluorine cleaning techniques may undesirably generate particles or solid by-product after reacting with the III-V group materials or III-V group compounds, thereby adversely creating surface contamination or keep the native oxide intact, which may eventually lead to device failure.

Other conventional cleaning techniques for removing native oxides from a surface exist but generally have one or more drawbacks. Sputter etch processes have been used to reduce or remove contaminants, but are generally only effective in large features or in small features having low aspect ratios, such as less than about 4:1. In addition, sputter etch processes can damage other material layers disposed on the substrate by physical bombardment. Wet etch processes utilizing hydrofluoric or hydrochloric acid are also used to remove native oxides, but are less effective in smaller features with aspect ratios exceeding 4:1, as surface tension prevents acids from wetting the entire feature. In addition, conventional HF cannot remove natives of III-V group compounds.

Accordingly, there is a need in the art for methods of removing native oxides and residue from a substrate surface having III-V group containing materials.

SUMMARY

Embodiments of the present disclosure provide methods for removing native oxides and residues using a multiple stage cleaning process at relatively low temperature, such as less than 550 degrees Celsius. In one example, the method for removing native oxides from a substrate includes supplying a first gas mixture including an inert gas onto a surface of a material layer disposed on a substrate into a first processing chamber, wherein the material layer is a III-V group containing layer for a first period of time, supplying a second gas mixture including an inert gas and a hydrogen containing gas onto the surface of the material layer for a second period of time, and supplying a third gas mixture including a hydrogen containing gas to the surface of the material layer while maintaining the substrate at a temperature less than 550 degrees Celsius.

In another example, a method for removing native oxides from a material layer disposed on a substrate includes performing a surface treatment process to alter bonding structures of native oxide on a material layer disposed on a substrate, wherein the material layer is a III-V group containing layer, performing a native oxide removal process to remove the native oxide from the material layer, and performing a post-cleaning baking process on the material layer at a temperature less than 550 degrees Celsius.

In yet another example, a method for removing native oxides from a material layer disposed on a substrate includes supplying an inert gas to a surface of a material layer disposed on a substrate to alter bonding structures of native oxide on the surface of the material layer for a first period of time at a first temperature, wherein the material layer is a III-V group containing layer, supplying a $H_2$ gas and an inert gas to remove the native oxide from the material layer for a second period of time at a second temperature, and supplying a $H_2$ gas to remove residual oxide from the material layer for a third period of time while maintaining the substrate at a third temperature, wherein the third temperature is higher than the first and the second temperature.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

As will be explained in greater detail below, a substrate having a surface is treated to remove native oxides or other contaminants prior to forming a device structure, such as a gate structure, a contact structure, a metal-insulator-semiconductor (MIS), a metal silicide layer, or the like, on the substrate. The term "substrate" as used herein refers to a layer of material that serves as a basis for subsequent processing operations and includes a surface to be cleaned. For example, the substrate can include one or more material containing germanium or III-V group containing compounds, such as Ge, SiGe, GaAs, InP, InAs, GaAs, GaP, InGaAs, InGaAsP, GaSb, InSb and the like, or combinations thereof. Furthermore, the substrate can also include dielectric materials such as silicon dioxide, organosilicates, and carbon doped silicon oxides. The substrate may also include one or more conductive metals, such as nickel, titanium, platinum, molybdenum, rhenium, osmium, chromium, iron, aluminum, copper, tungsten, or combinations thereof. Further, the substrate can include any other materials such as metal nitrides, metal oxides and metal alloys, depending on the application. In one or more embodiments, the substrate can form a contact structure, a metal silicide layer, or a gate structure including a gate dielectric layer and a gate electrode layer to facilitate connecting with an interconnect feature, such as a plug, via, contact, line, and wire, subsequently formed thereon, or suitable structures utilized in semiconductor devices.

Moreover, the substrate is not limited to any particular size or shape. The substrate can be a round wafer having a 200 mm diameter, a 300 mm diameter, a 450 mm diameter or other diameters. The substrate can also be any polygonal, square, rectangular, curved or otherwise non-circular workpiece, such as a polygonal glass, plastic substrate used in the fabrication of flat panel displays.

Embodiments of the present disclosure describe cleaning processes that may be used to clean a substrate surface prior to a deposition or an etching process. The substrate surface may include a III-V group (or Ge containing) containing materials. The cleaning process utilizes multiple stages, including a pretreatment process, cleaning process and a post-cleaning process at low temperature, such as less than 550 degrees Celsius, to react with the native oxide or other contaminants and efficiently remove undesired native oxides and/or other contaminants from the substrate surface.

Figure 1:
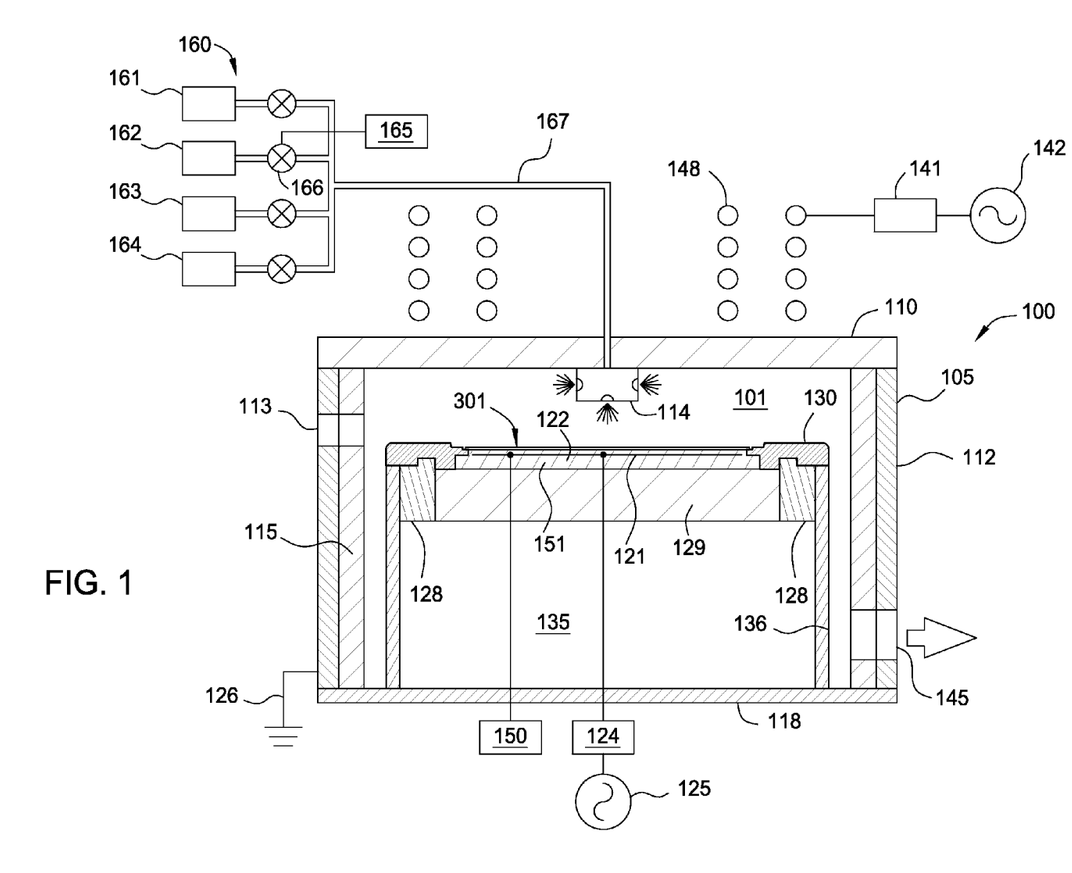
FIG. 1 is a schematic cross-sectional view of a processing chamber configured to perform a cleaning process according to one or more embodiments of the disclosure.

FIG. 1 is a simplified cutaway view for an exemplary processing chamber 100 suitable for cleaning a substrate 301 having a III-V group material disposed thereon. The exemplary processing chamber 100 is suitable for removing one or more native oxide or residuals from the substrate 301. One example of the process chamber 100 that may be adapted to benefit from the disclosure is an AdvantEdge™ Mesa™ Etch processing chamber, available from Applied Materials, Inc., located in Santa Clara, Calif. It is contemplated that other process chambers, including those from other manufactures, may be adapted to practice embodiments of the disclosure.

The cleaning processing chamber 100 includes a chamber body 105 having a chamber volume 101 defined therein. The chamber body 105 has sidewalls 112 and a bottom 118 which are coupled to ground 126. The sidewalls 112 have a liner 115 to protect the sidewalls 112 and extend the time between maintenance cycles of the cleaning processing chamber 100. The dimensions of the chamber body 105 and related components of the cleaning processing chamber 100 are not limited and generally are proportionally larger than the size of the substrate 301 to be processed therein. Examples of substrate sizes include 200 mm diameter, 250 mm diameter, 300 mm diameter and 450 mm diameter, among others.

The chamber body 105 supports a chamber lid assembly 110 to enclose the chamber volume 101. The chamber body 105 may be fabricated from aluminum or other suitable materials. A substrate access port 113 is formed through the sidewall 112 of the chamber body 105, facilitating the transfer of the substrate 301 into and out of the cleaning processing chamber 100. The access port 113 may be coupled to a transfer chamber and/or other chambers of a substrate processing system (not shown).

A pumping port 145 is formed through the sidewall 112 of the chamber body 105 and connected to the chamber volume 101. A pumping device (not shown) is coupled through the pumping port 145 to the chamber volume 101 to evacuate and control the pressure therein. The pumping device may include one or more pumps and throttle valves.

A gas panel 160 is coupled by a gas line 167 to the chamber body 105 to supply process gases into the chamber volume 101. The gas panel 160 may include one or more process gas sources 161, 162, 163, 164 and may additionally include inert gases, non-reactive gases, and reactive gases, if desired. Examples of process gases that may be provided by the gas panel 160 include, but are not limited to, hydrocarbon containing gas including methane ($CH_4$), sulfur hexafluoride ($SF_6$), carbon tetrafluoride ($CF_4$), hydrogen bromide (HBr), hydrocarbon containing gas, argon gas (Ar), chlorine (Cl$_2$), nitrogen (N2), helium (He) and oxygen gas (O$_2$). Additionally, process gasses may include chlorine, fluorine, oxygen and hydrogen containing gases such as BCl$_3$, C$_2$F$_4$, C$_4$F$_8$, C$_4$F$_6$, CHF$_3$, CH$_2$F$_2$, CH$_3$F, NF$_3$, CO$_2$, SO$_2$, CO, and H$_2$ among others.

Valves 166 control the flow of the process gases from the sources 161, 162, 163, 164 from the gas panel 160 and are managed by a controller 165. The flow of the gases supplied to the chamber body 105 from the gas panel 160 may include combinations of the gases.

The lid assembly 110 may include a nozzle 114. The nozzle 114 has one or more ports for introducing the process gases from the sources 161, 162, 164, 163 of the gas panel 160 into the chamber volume 101. After the process gases are introduced into the cleaning processing chamber 100, the gases are energized to form plasma. An antenna 148, such as one or more inductor coils, may be provided adjacent to the cleaning processing chamber 100. An antenna power supply 142 may power the antenna 148 through a match circuit 141 to inductively couple energy, such as RF energy, to the process gas to maintain a plasma formed from the process gas in the chamber volume 101 of the cleaning processing chamber 100. Alternatively, or in addition to the antenna power supply 142, process electrodes below the substrate 301 and/or above the substrate 301 may be used to capacitively couple RF power to the process gases to maintain the plasma within the chamber volume 101. The operation of the power supply 142 may be controlled by a controller, such as controller 165, that also controls the operation of other components in the cleaning processing chamber 100.

A substrate support pedestal 135 is disposed in the chamber volume 101 to support the substrate 301 during processing. The support pedestal 135 may include an electrostatic chuck 122 for holding the substrate 301 during processing. The electrostatic chuck (ESC) 122 uses the electrostatic attraction to hold the substrate 301 to the substrate support pedestal 135. The ESC 122 is powered by an RF power supply 125 integrated with a match circuit 124. The ESC 122 comprises an electrode 121 embedded within a dielectric body. The electrode 121 is coupled to the RF power supply 125 and provides a bias which attracts plasma ions, formed by the process gases in the chamber volume 101, to the ESC 122 and substrate 301 positioned thereon. The RF power supply 125 may cycle on and off, or pulse, during processing of the substrate 301. The ESC 122 has an isolator 128 for the purpose of making the sidewall of the ESC 122 less attractive to the plasma to prolong the maintenance life cycle of the ESC 122. Additionally, the substrate support pedestal 135 may have a cathode liner 136 to protect the sidewalls of the substrate support pedestal 135 from the plasma gases and to extend the time between maintenance of the cleaning processing chamber 100.

Furthermore, the electrode 121 is coupled to a power source 150. The power source 150 provides a chucking voltage of about 200 volts to about 2000 volts to the electrode 121. The power source 150 may also include a system controller for controlling the operation of the electrode 121 by directing a DC current to the electrode 121 for chucking and de-chucking the substrate 301.

The ESC 122 may include heaters disposed therein and connected to a power source (not shown), for heating the substrate, while a cooling base 129 supporting the ESC 122 may include conduits for circulating a heat transfer fluid to maintain a temperature of the ESC 122 and substrate 301 disposed thereon. The ESC 122 is configured to perform in the temperature range required by the thermal budget of the device being fabricated on the substrate 301. For example, the ESC 122 may be configured to maintain the substrate 301 at a temperature of about minus about 25 degrees Celsius to about 500 degrees Celsius for certain embodiments.

The cooling base 129 is provided to assist in controlling the temperature of the substrate 301. To mitigate process drift and time, the temperature of the substrate 301 may be maintained substantially constant by the cooling base 129 throughout the time the substrate 301 is in the cleaning chamber. In one embodiment, the temperature of the substrate 301 is maintained throughout subsequent cleaning processes at about 30 to 120 degrees Celsius.

A cover ring 130 is disposed on the ESC 122 and along the periphery of the substrate support pedestal 135. The cover ring 130 is configured to confine etching gases to a desired portion of the exposed top surface of the substrate 301, while shielding the top surface of the substrate support pedestal 135 from the plasma environment inside the cleaning processing chamber 100. Lift pins (not shown) are selectively moved through the substrate support pedestal 135 to lift the substrate 301 above the substrate support pedestal 135 to facilitate access to the substrate 301 by a transfer robot (not shown) or other suitable transfer mechanism.

The controller 165 may be utilized to control the process sequence, regulating the gas flows from the gas panel 160 into the cleaning processing chamber 100 and other process parameters. Software routines, when executed by the CPU, transform the CPU into a specific purpose computer (controller) that controls the cleaning processing chamber 100 such that the processes are performed in accordance with the present disclosure. The software routines may also be stored and/or executed by a second controller (not shown) that is collocated with the cleaning processing chamber 100.

The substrate 301 has various film layers disposed thereon which may include at least one III-V group (or germanium containing material) disposed on the substrate 301. The various film layers may require cleaning recipes which are unique for the different compositions of the other film layers in the substrate 301. Each cleaning processing chamber may be configured to clean the substrate 301 with one or more of the cleaning recipes. In one embodiment, the cleaning processing chamber 100 is configured to at least clean a III-V group material layer 502 (depicted in FIG. 5A-5C) disposed on the substrate 301. For processing parameters provided herein, the cleaning processing chamber 100 is configured to process a 300 mm diameter substrate, i.e., a substrate having a plan area of about 0.0707 m$^2$, or a 450 mm diameter substrate. The process parameters, such as flow and power, may generally be scaled proportionally with the change in the chamber volume or substrate plan area.

Figure 2:
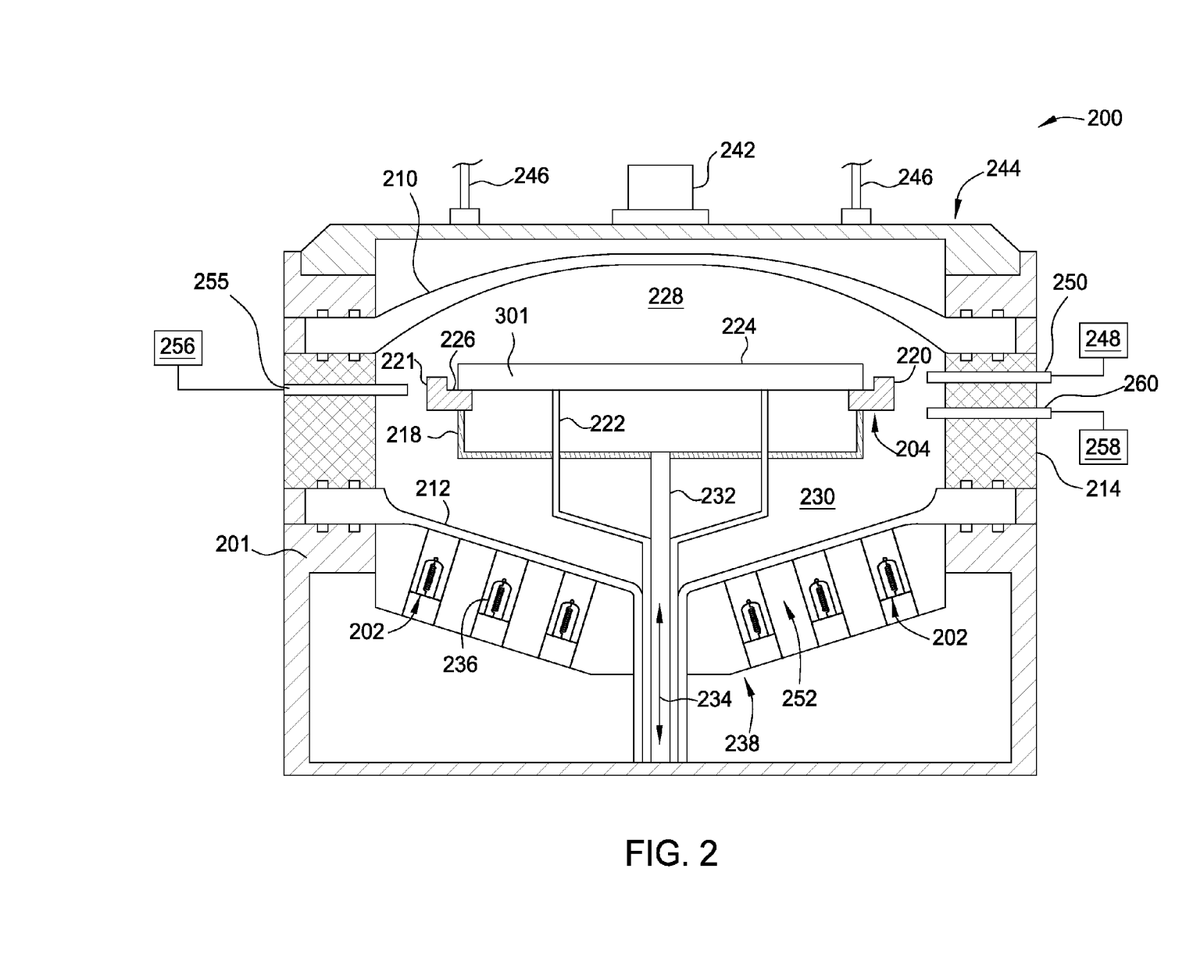
FIG. 2 is a schematic cross-sectional view of a processing chamber configured to perform a post-cleaning baking process according to one or more embodiments of the disclosure.

FIG. 2 illustrates a schematic view of a processing chamber 200 according to one embodiment. The processing chamber 200 may be used to process one or more substrates 301, including providing thermal/heat energy, to perform a baking process on a III-V group material surface disposed on the substrate 301. The substrate 301 may include, but is not limited to 200 mm, 300 mm or larger single crystal silicon (Si), multi-crystalline silicon, polycrystalline silicon, germanium (Ge), silicon carbide (SiC), glass, gallium arsenide (GaAs), cadmium telluride (CdTe), cadmium sulfide (CdS), copper indium gallium selenide (CIGS), copper indium selenide (CuInSe$_2$), gallium indium phosphide (GaInP$_2$), as well as heterojunction substrates, such as GaInP/GaAs/Ge or ZnSe/GaAs/Ge substrates. The processing chamber 200 may include an array of radiant heating lamps 202 for heating, among other components, a back side 204 of a susceptor 220 disposed within walls 201 of the processing chamber 200, and the substrate 301. The susceptor 220 is supported by a susceptor support 218. In the embodiment shown in FIG. 2, the susceptor 220 has a ring shaped body with a central opening 203 and a lip 221 that extends from the edge of the susceptor 220 and circumscribes the central opening 203. The lip 221 and the front side 202 of the susceptor 220 create a pocket 226 that supports the substrate 301 from the edge of the substrate to facilitate exposure of the substrate 301 to the thermal radiation provided by the lamps 202.

The susceptor 220 is located within the processing chamber 200 between an upper dome 210 and a lower dome 212. The upper dome 210 is coupled to the lower dome 212 by a base ring 214. The upper dome 210, the lower dome 212 and the base ring 214 generally define an internal region of the processing chamber 200. In some embodiments, the array of radiant heating lamps 202 may be disposed over the upper dome 210. The substrate 301 can be brought into the processing chamber 200 and positioned onto the susceptor 220 through a loading port (not shown) formed in the base ring 214.

The susceptor 220 is shown in an elevated processing position, but may be moved vertically by an actuator (not shown) to a loading position below the processing position to allow lift pins 222 to pass through holes in the susceptor support 218, and raise the substrate 301 from the susceptor 220. A robot (not shown) may then enter the processing chamber 200 to engage and remove the substrate 301 therefrom though the loading port. The susceptor 220 then may be actuated up to the processing position to place the substrate 301, with a device side 224 facing up, on a front side 202 of the susceptor 220.

The susceptor 220 and the susceptor support 218, while located in the processing position, divide the internal volume of the processing chamber 200 into a process gas region 228 that is above the substrate 301, and a purge gas region 230 below the susceptor 220 and the susceptor support 218. The susceptor 220 and susceptor support 218 are rotated during processing by a supporting cylindrical central shaft 232, to minimize the effect of thermal and process gas flow spatial anomalies within the processing chamber 100 and thus facilitate uniform processing of the substrate 301. The central shaft 232 moves the substrate 301 in an up and down direction 234 during loading and unloading, and in some instances, processing of the substrate 301.

In general, the central window portion of the upper dome 210 and the bottom of the lower dome 212 are formed from an optically transparent material, such as quartz. One or more lamps, such as an array of the lamps 202, can be disposed adjacent to and beneath the lower dome 212 in a specified, optimal desired manner around the central shaft 232 to independently control the temperature at various regions of the substrate 301. The heated substrate 301 is exposed to the process gases, thereby facilitating the thermal processing (i.e., deposition) of a material onto the upper surface of the substrate 301.

The lamps 202 may be configured to include bulbs 236 and be configured to heat the substrate 301 to a temperature within a range of about 200 degrees Celsius to about 1600 degrees Celsius, for example, about 300 degrees Celsius to about 1200 degrees Celsius or about 500 to about 580 degrees Celsius. Each lamp 202 is coupled to a power distribution board (not shown) through which power is supplied to each lamp 202. The lamps 202 are positioned within a lamphead 238 which may be cooled during or after processing by, for example, a cooling fluid introduced into channels 252 located between the lamps 202. The lamphead 238 conductively and radioactively cools the lower dome 212 due in part to the close proximity of the lamphead 238 to the lower dome 212. The lamphead 238 may also cool the lamp walls and walls of the reflectors (not shown) around the lamps. Alternatively, the lower dome 212 may be cooled by a convective approach known in the industry. Depending upon the application, the lampheads 238 may or may not be in contact with the lower dome 212. As a result of backside heating of the substrate 301, the use of an optical pyrometer 242 for temperature measurements/control on the substrate 301 and the susceptor 220 may also be utilized.

A reflector 244 may be optionally placed outside the upper dome 210 to reflect infrared light that is radiating off the substrate 301 back onto the substrate 301. The reflector 244 may be fabricated from a metal such as aluminum or stainless steel. The efficiency of the reflection can be improved by coating a reflector area with a highly reflective coating such as with gold. The reflector 244 can have one or more machined channels 246 connected to a cooling source (not shown). The channel 246 connects to a passage (not shown) formed on a side of the reflector 244. The passage is configured to carry a flow of a fluid such as water and may run horizontally along the side of the reflector 244 in any desired pattern covering a portion or entire surface of the reflector 244 for cooling the reflector 244.

Process gas supplied from a process gas supply source 248 is introduced into the process gas region 228 through a process gas inlet 250 formed in the sidewall of the base ring 214. The process gas inlet 250 is configured to direct the process gas in a generally radially inward direction. During the film formation process, the susceptor 220 may be located in the processing position, which is adjacent to and at about the same elevation as the process gas inlet 250, allowing the process gas to flow up and round along a flow path across the upper surface of the substrate 301 in a laminar flow. The process gas exits the process gas region 228 through a gas outlet 255 located on the side of the processing chamber 200 opposite the process gas inlet 250. Removal of the process gas through the gas outlet 255 may be facilitated by a vacuum pump 256 coupled thereto. As the process gas inlet 250 and the gas outlet 255 are aligned and disposed approximately at the same elevation, it is believed that such a parallel arrangement, when combined with a flatter upper dome 210 provides generally planar, uniform gas flow across the substrate 301. Further radial uniformity may be provided by the rotation of the substrate 301 by the susceptor 220.

Purge gas may be supplied from a purge gas source 258 to the purge gas region 230 through an optional purge gas inlet 260 (or through the process gas inlet 250) formed in the sidewall of the base ring 214. The purge gas inlet 260 is disposed at an elevation below the process gas inlet 250. The purge gas inlet 260 is configured to direct the purge gas in a generally radially inward direction. During the process, the susceptor 220 may be located at a position such that the purge gas flows down and round along a flow path across the back side 204 of the susceptor 220 in a laminar flow. Without being bound by any particular theory, the flowing of the purge gas is believed to prevent or substantially avoid the flow of the process gas from entering into the purge gas region 230, or to reduce diffusion of the process gas entering the purge gas region 230 (i.e., the region under the susceptor 220). The purge gas exits the purge gas region 230 and is exhausted out of the processing chamber 200 through the gas outlet 255, which is located on the side of the processing chamber 200 opposite the purge gas inlet 260.

Figure 3:
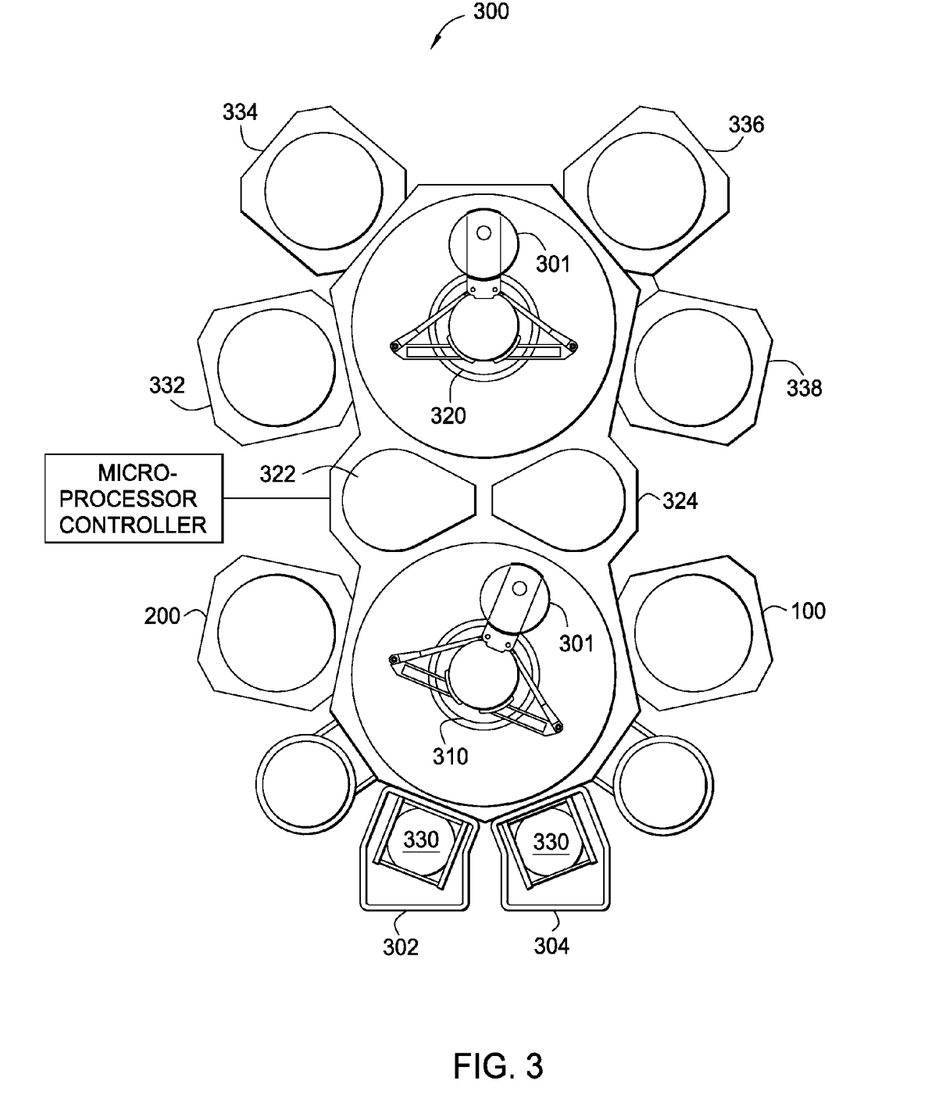
FIG. 3 is a schematic plan view diagram of an exemplary multi-chamber processing system configured to perform a cleaning process on a substrate, according to one or more embodiments of the disclosure.

FIG. 3 is a schematic plan view diagram of an exemplary multi-chamber processing system 300 configured to perform a cleaning process and a post-cleaning baking process on substrates 301, according to one or more embodiments of the disclosure. Multi-chamber processing system 300 includes one or more load lock chambers 302, 304 for transferring substrates 301 into and out of the vacuum portion of multi-chamber processing system 300. Consequently, load lock chambers 302, 304 can be pumped down to introduce substrates into multi-chamber processing system 300 for processing under vacuum. A first robot 310 transfers substrates 301 between load lock chambers 302 and 304, transfer chambers 322 and 324, and a first set of one or more processing chambers 200 and 100. A second robot 320 transfers substrates 301 between transfer chambers 322 and 324 and processing chambers 332, 334, 336, 338.

One or both of the processing chambers 100 and 200 may be configured to perform a cleaning process and post-cleaning baking process, according to embodiments of the disclosure described herein. The transfer chambers 322, 324 can be used to maintain ultra-high vacuum conditions while substrates are transferred within multi-chamber processing system 300. Processing chambers 332, 334, 336, 338 are configured to perform various substrate-processing operations including epitaxy deposition process, cyclical layer deposition (CLD), atomic layer deposition (ALD), chemical vapor deposition (CVD), physical vapor deposition (PVD), and the like. In one embodiment, one or more of processing chambers 332, 334, 336, 338 are configured to deposit a contact structure, a gate structure, or a pre-gate surface, or other suitable structures, comprising a plurality of material layers.

Figure 4:
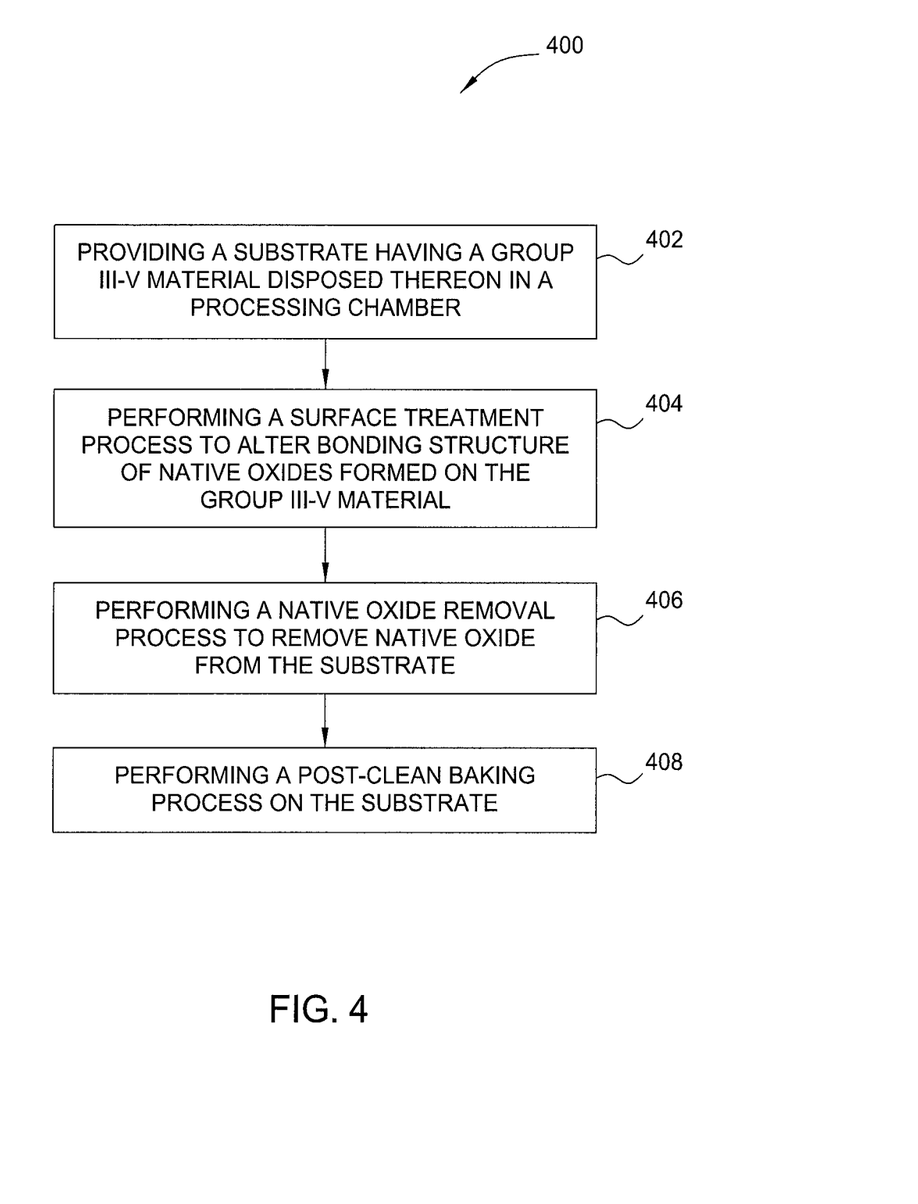
FIG. 4 is a flowchart of a method for processing a substrate in a processing chamber, according to one or more embodiments of the present disclosure.
Figure 5A:
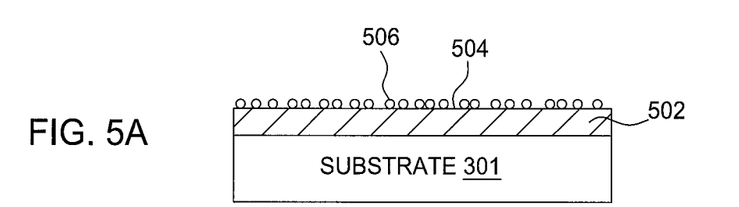
FIGS. 5A-5C are cross-sectional views of a substrate processed in the processing chamber according to the method depicted in FIG. 4, according to one or more embodiments of the present disclosure.
Figure 5B:
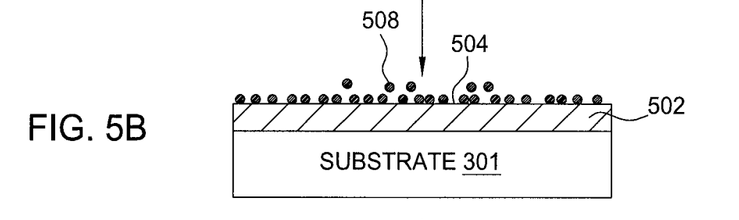
Figure 5C:
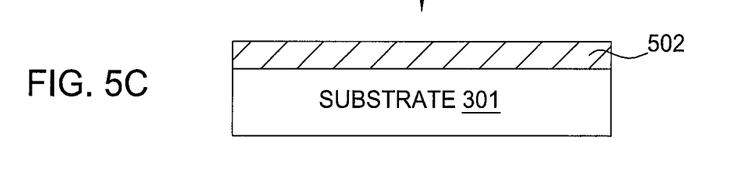

FIG. 4 is a flow diagram of a process 400 for removing native oxide from a substrate surface having a III-V compound (or germanium) containing material. FIGS. 5A-5C are cross-sectional views of the substrate when performing the native oxide removal process at the different manufacturing stages depicted in FIG. 4.

The process 400 starts at operation 402 by transferring the substrate 301, as shown in FIG. 5A, into a processing chamber, such as the cleaning processing chamber 100 depicted in FIG. 1, to perform a native oxide removal process. In one embodiment, the substrate 301 may be a 200 mm, 300 mm or 450 mm silicon wafer, or other substrate used to fabricate microelectronic devices and the like. In one embodiment, the substrate 301 may be a material such as III-V group compound containing substrate including gallium arsenide, indium phosphine and the like, crystalline silicon (e.g., Si<100>, Si<111> or Si<001>), silicon oxide, strained silicon, $silicon_{(1-x)}germanium_x$, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 301 may have a circular wafer, as well as, rectangular or square panels. Unless otherwise noted, the examples described herein are conducted on substrates having a 300 mm diameter or a 450 mm diameter. In one embodiment, the substrate 301 has a material layer 502 disposed thereon. The material layer 502 may be a III-V compound containing layer or germanium (Ge) containing layer. In some examples wherein the material layer 502 is not present, the substrate 301 itself may be a III-V compound containing layer or germanium (Ge) containing layer. Suitable examples of the germanium (Ge) containing layer include Ge or SiGe, and the like. Suitable examples of the III-V compound containing layer include GaAs, InP, InAs, GaAs, GaP, InGaAs, InGaAsP, GaSb, InSb, the like, or combinations thereof.

Native oxide 506 is formed on a surface 504 of the material layer 502 on the substrate 301, due to the exposure to either atmosphere or to one or more fabrication processes that cause native oxide 506 to form, such as a wet or a moisture process.

As discussed above, as the substrate 301 may be exposed to air or ambient atmosphere, native oxide 506 formed on the substrate surface 504 may have oxygen, nitrogen, carbon, sulfur, or other elements commonly contained in the air. Accordingly, the native oxide removal process as performed herein is configured to remove the native oxide 506 including not only the oxide layer but also other derivative layers, including carbon, nitrogen, sulfur elements or the like, that may be found on the substrate surface 504.

At operation 404, a surface treatment process is performed to treat the native oxide 506 formed on the substrate 301. The surface treatment process is performed by supplying a surface treatment gas mixture into the processing chamber 100 to treat the substrate surface 504 by altering the bonding structures of the native oxide 506, thereby forming a treated native oxide 508, as shown in FIG. 5B. The treated native oxide 508 becomes fragile and more easily removed from the substrate surface 504 (compared to untreated native oxides) during the subsequent cleaning process.

The surface treatment process uses a plasma formed from the surface treatment gas mixture to plasma treat the native oxide 506 and the surface 504 of the material layer 502. The plasma activates the native oxide 506 (or alter bonding structures of native oxide 506) or other source of contaminants into an excited state, thereby forming treated native oxide 508. The treated native oxide 508 may then easily react with cleaning gases subsequently supplied into the processing chamber 100, forming volatile gaseous by-products that readily pump out of the processing chamber 100.

In one embodiment, the surface treatment gas mixture includes at least one inert gas. It is believed that the inert gas supplied in the surface treatment gas mixture may assist extending the life of the ions in the plasma formed from the surface treatment gas mixture as well as providing gentle bombardment of the substrate surface. Increased life of the ions may assist reacting with and activating the native oxide 506 on the material layer 502 more thoroughly, thus enhancing the removal of the treated native oxide 508 from the material layer 502 during the subsequent cleaning process. In addition, the inert gas supplied in the surface treatment gas mixture may break native oxide of the III-V group compound ($MO_X$, M belongs to III-V group elements, such as In, Ga, As, O), for example breaking atom-atom bonding in the native oxide 506, thereby forming weak and dangling bonds from In—O or P—O bonds, for example, on the native oxide surface. Treated native oxide 508 with In—O or P—O bond terminals may easily to be absorbed by other etchants subsequently supplied to the processing chamber 100, thereby assisting the ease of removal of the treated native oxide 508 from the substrate surface. The surface treatment process provides a more efficient surface activating process and therefore increasing the efficiency of the treating substrate surface during surface treatment process with minimum damage to substrates.

Furthermore, during the surface treatment process, a RF source/bias applied to generate plasma in the surface treatment gas mixture may be maintained low so as to prevent damage or undesired surface bombardment to the substrate surface.

Increased life time of the ions may assist with reacting and activating the native oxide 506 on the substrate 301 more thoroughly, thereby enhancing the removal of the treated native oxide 508 from the substrate 301 during the surface treatment process.

In one embodiment, the inert gas supplied into the processing chamber 100 includes at least one of He, Ar, Kr, Ne, and the like. The inert gas supplied into the processing chamber 100 includes at least one of Ar, He, such as Ar, and the like. In an exemplary embodiment, the inert gas supplied in the surface treatment gas mixture to perform the surface treatment process is Ar gas.

During the surface treatment process, several process parameters may be regulated to control the surface treatment process. In one exemplary embodiment, a process pressure in the processing chamber 100 is regulated between about 5 mTorr to about 500 mTorr, such as between about 10 mTorr and about 200 mTorr, for example, at about 20 mTorr. A relatively low RF source power, such as less than 300 Watts, may be applied to maintain a plasma in the surface treatment gas mixture. For example, a RF source power of about less than 300 Watts, such as about 150 Watts to about 280 Watts, may be applied to maintain a plasma inside the processing chamber 100. A relatively low RF bias power, such as less than 100 Watts, may be applied in the surface treatment gas mixture to maintain plasma formed with a desired directionality. For example, a RF bias power of less than 100 Watts, such as less than 40 Watts, for example between about 10 Watts and about 30 Watts, may be applied in the surface treatment gas mixture. It is believed that the combination of the low RF source power and the low RF bias power may provide low energy atomic Ar or He atoms or other types of active species so as to alter bonding structures of the native oxide 506 on the material layer 502 without overly damage/bombardment to the substrate surface. The low power surface treatment process provides a more efficient surface activating process and therefore increasing the efficiency of the treated substrate surface during pre-cleaning process with minimum damage to substrates.

The inert gas supplied in the surface treatment gas mixture may be flowed into the chamber at a rate between about 200 sccm to about 5000 sccm. A substrate temperature is maintained between about 25 degrees Celsius to about 200 degrees Celsius, for example at a temperature less than 150 degrees Celsius, such as between 30 degrees and about 90 degrees Celsius.

In one embodiment, the substrate is subjected to perform the surface treatment process for a first period of time of between about 5 seconds to about 5 minutes, depending on the operating temperature, pressure and flow rate of the gas. For example, the substrate can be exposed for about 10 seconds to about 120 seconds. In an exemplary embodiment, the substrate is exposed for about 40 seconds or less.

It is noted that the amount of each gas introduced into the processing chamber may be varied and adjusted to accommodate, for example, the thickness of the native oxide layer to be removed, the geometry of the substrate being cleaned, the volume capacity of the plasma, the volume capacity of the chamber body, as well as the capabilities of the vacuum system coupled to the chamber body.

At operation 406, after supplying the surface treatment gas mixture in the processing chamber 100 to alter the bonding structures of the native oxide 506 on the material layer 502, a native oxide removal process is then performed to remove the treated native oxide 508 from the surfaces 504 of the material layer 502, as shown in FIG. 5C. The native oxide removal process is performed by supplying a cleaning gas mixture into the processing chamber 100 to form a plasma from the cleaning gas mixture for removing the treated native oxide 508. As the treated native oxide 508 has been treated to have weak and dangling bonds with In—O or P—O bond terminals, for example, on the surface, during the oxide removal process, the aggressive etchants from the cleaning gas mixture may easily attack the weak and dangling bonds with In—O or P—O bond terminals and efficiently remove the treated native oxide 508 from the substrate surface.

In one embodiment, the cleaning gas mixture used to remove treated native oxides 508 is a mixture of inert gas and hydrogen containing gas. Suitable examples of the hydrogen containing gas include $H_2$, $NH_3$, $CH_4$, $C_2H_4$ and the like. Suitable examples of the inert gas supplied in the cleaning gas mixture include He, Ar or the like. In one example, the hydrogen containing gas supplied in the cleaning gas mixture is $H_2$ and the inert gas supplied in the cleaning gas mixture is Ar. The amount of each gas introduced into the processing chamber may be varied and adjusted to accommodate, for example, the thickness of the native oxide layer to be removed, the geometry of the substrate being cleaned, the volume capacity of the plasma, the volume capacity of the chamber body, as well as the capabilities of the vacuum system coupled to the chamber body.

In one or more embodiments, the molar ratio by volume of the cleaning gas mixture is between about 1:10 and 10:1 (hydrogen containing gas to inert gas). It is believed that the hydrogen containing gas supplied in the cleaning gas mixture may assist reacting with the excited oxygen species, forming volatile $H_2O$ (e.g., water) vapor that readily pumps out of the processing chamber.

The operating pressure within the chamber can be varied. The pressure is maintained between about 1 Torr and about 50 Torr. A relatively low RF source power may be applied to maintain a plasma in the cleaning gas mixture. For example, a low RF source power of less than 800 Watts may be applied to maintain a plasma inside the processing chamber 100. The low RF source power may be pulsed (supplied in pulse mode) or continued (supplied in continuous mode) as needed. A relatively low RF bias power less than 40 Watts may also be optionally supplied in the gas mixture. The pulsing frequency at which the RF source power is applied around 5000 Hz. The pulsing frequency can range from about 500 Hz to about 10000 Hz. Similarly, as discussed above, the relatively low RF regime controlled during the process may assist providing gentle plasma reaction to remove the treated native oxide 508 from the substrate surface without overly damage the substrate surface. The substrate temperature is controlled at a temperature less than 150 degrees Celsius, such as between about 30 degrees Celsius and about 90 degrees Celsius.

In one embodiments, the substrate is subjected to perform the native oxide removal process for a second period of time of between about 5 seconds to about 5 minutes, depending on the operating temperature, pressure and flow rate of the gas. For example, the substrate can be exposed for about 5 seconds to about 90 seconds. In an exemplary embodiment, the substrate is exposed for about 60 seconds or less.

At operation 408, after the native oxide 506 is removed from the substrate, a post-cleaning baking process may be performed on the surfaces 504 top remove residual oxygen, if any, from the substrate surface in the processing chamber 200 depicted in FIG. 2. The post-cleaning baking process performed at the processing chamber 200 may be controlled at a relatively low thermal treatment process, such as less than 550 degrees Celsius, as compared to a conventional RTP thermal process or Epi deposition heating process. It is believed that overly high temperature performed on a III-V group compound substrate may result in the atoms and/or elements in the III-V group compound diffusion (e.g., P, or As element diffusion) and/or segregation (e.g., In or Ga element segregation), altering surface stoichiometry of the III-V group compound substrate. Thus, a relatively low temperature post-cleaning baking process, such as less than 550 degrees Celsius, may not only assist providing a clean substrate surface, but also maintain integrity of lattice structure from the III-V group compound without damage the bonding substrate thereof.

The post-cleaning baking process at operation 408 is performed to remove the cleaning residuals, providing a clean surface, which may provide a good adherence for atoms from subsequent processes to nucleate and adhere thereon. Furthermore, the post-cleaning baking process as performed at operation 408 may also help remove and blow off surface particles, cleaning byproducts, or other surface impurities from the substrate surface, thereby providing a cleaning surface to have the subsequent layer deposited thereon with minimum resistivity or interface contamination.

In one embodiment, the post-cleaning baking gas mixture may be supplied during the post-cleaning baking process. The post-cleaning baking gas mixture includes at least a hydrogen containing gas, a group III or group V containing gas. It is believed that hydrogen containing gas supplied in the post-cleaning baking gas mixture may react with the oxygen residuals formed on the substrate surface, thereby forming volatile gas byproduct, such as $H_2O$ containing ions or radicals, which readily pumps out of the chamber 200. Similarly, the group III or group V containing gas may also react with the oxygen residuals formed on the substrate surface.

In one embodiment, the hydrogen containing gas be supplied into the processing chamber 200 includes at least one of $H_2$, $H_2O$, and the like. Group III or group V gas that may be used includes As or P containing precursor, such as $AsH_3$, TbAs in the gas mixture for processing GaAs, InGaAs, $PH_3$ containing surfaces, or TbP in the gas mixture for InP, GaP containing surfaces and the like. The group V gas can be used to preserve the III-V group surface from decomposition during the post-cleaning baking process.

In an exemplary embodiment, the hydrogen containing gas supplied in the processing chamber 200 to perform the post treatment process is $H_2$ gas.

During the post-cleaning baking process, several process parameters may be regulated to control the post-cleaning baking process. In one exemplary embodiment, a process pressure in the processing chamber 200 is regulated between about 100 mTorr to about 5000 mTorr, such as between about 300 mTorr and about 3000 mTorr, for example, at about 2000 mTorr. The hydrogen containing gas supplied in the post-cleaning baking process may be flowed into the chamber 200 at a rate between about 200 sccm to about 5000 sccm. A substrate temperature is maintained less than 550 degrees Celsius, such as between about 300 degrees Celsius to about 500 degrees Celsius.

In one embodiments, the substrate is subjected to perform the post-cleaning baking process for a third period of time of between about 5 seconds to about 5 minutes, depending on the operating temperature, pressure and flow rate of the gas. For example, the substrate can be exposed for about 30 seconds to about 90 seconds. In another embodiment, the substrate is exposed for about 90 seconds or less.

Figure 6A:
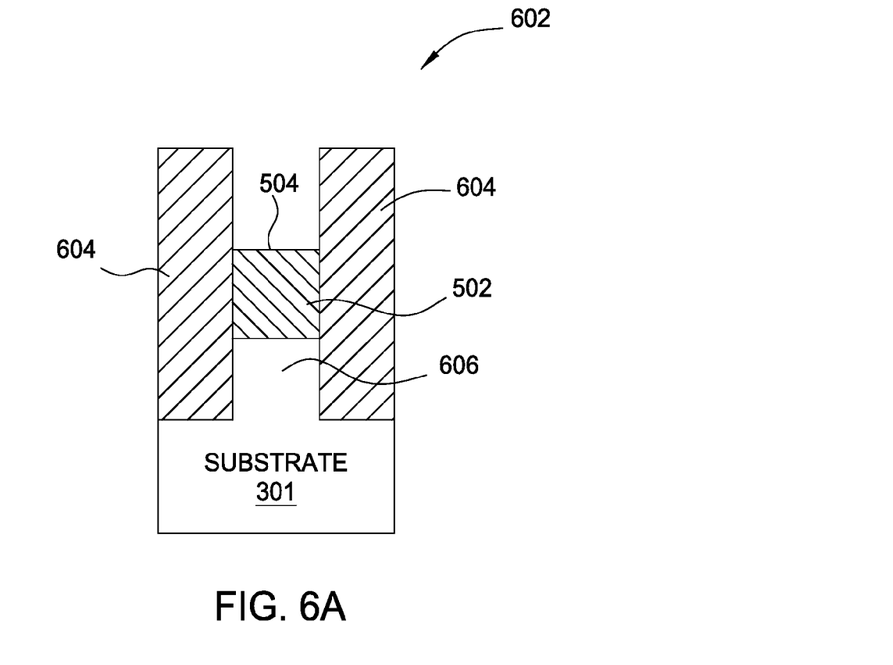
FIGS. 6A-6B is a cross-sectional view of a semiconductor device formed on a substrate that may utilize the method depicted in FIG. 4, according to one or more embodiments of the present disclosure.

After the post-cleaning baking process, the surface 504 of the material layer 502 is then exposed and cleaned. In one example, the material layer 502 with the cleaned surface 504 may be a contact structure 602 formed between an insulating material 604, as shown in FIG. 6A. Suitable insulating material 604 may be a silicon oxide containing material, such as BSG, BPSG, TEOS, silicon oxide or USG. A protrusion structure 606 may be formed as part of the substrate 301 that has the material layer 502 disposed thereon between the insulating material 604.

Figure 6B:
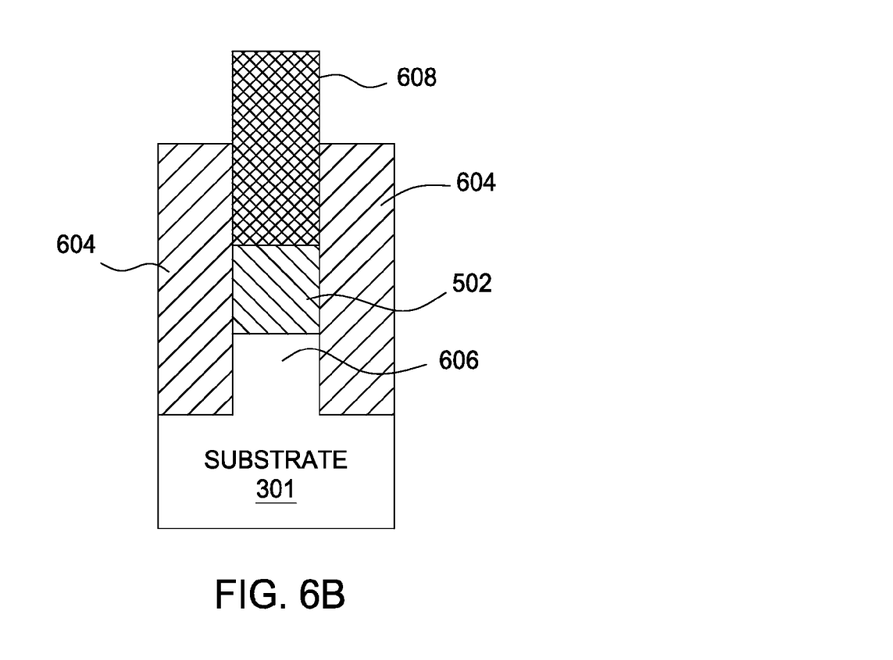

After the surface 504 of the material layer 502 is cleaned, another III-V group compound material 608 may be formed on the cleaned material layer 502, as shown in FIG. 6B, in the processing chamber 200 by an epitaxy deposition process. It is noted that the post-cleaning baking process performed at operation 408 and the epitaxy deposition process of the III-V group compound material 608 may be performed in a single processing chamber, such as the processing chamber 200 depicted in FIG. 2. By doing so, exposure of the substrate 301 to the ambient and adjacent atmosphere/environment may be eliminated, reducing the likelihood of the native oxide re-growth on the substrate 301. Additionally, the substrate temperature maintained during the epitaxy deposition process may be the same as the substrate temperature controlled during the post-cleaning baking process so that the processes are performed in the same processing chamber without temperature fluctuation. Alternatively, the III-V group compound material 608 may be formed by any suitable deposition process, such as physical vapor deposition (PVD), chemical vapor deposition (CVD), atomic layer deposition (ALD), and the like, as needed. In some example, the materials formed on the cleaned material layer 502 may be any materials other than III-V group compound as needed.

In summation, one or more examples of the present disclosure provide methods for removing native oxides and residues by performing a multiple-stage cleaning process including a surface treatment process, a native oxide removal process and a post-cleaning baking process a substrate having a III-V compound containing material. Such process is advantageously performed at a relatively low temperature, such as less than 550 degrees Celsius, to provide a clean surface for a subsequent material, such as a III-V group compound material, on the cleaning surface having another a III-V group compound material, without adversely damage the lattice structure of the III-V group compound material included in the substrate.

While the foregoing is directed to embodiments of the present invention, other and further embodiments of the invention may be devised without departing from the basic scope thereof, and the scope thereof is determined by the claims that follow.

We claim:

1. A method for removing native oxides from a material layer disposed on a substrate, comprising:
   supplying an inert gas to a surface of a material layer disposed on a substrate to alter bonding structures of native oxide on the surface of the material layer for a first period of time at a first temperature, wherein the material layer is a III-V group containing layer;
   supplying a $H_2$ gas and an inert gas to remove the native oxide from the material layer for a second period of time at a second temperature; and
   supplying a $H_2$ gas to remove residual oxide from the material layer for a third period of time while maintaining the substrate at a third temperature, wherein the third temperature is higher than the first and the second temperature.

2. The method for claim 1, further comprising:
forming a III-V group material on the material layer while maintaining the substrate at the third temperature.

* * * * *